(12) United States Patent
Mori

(10) Patent No.: US 7,109,945 B2
(45) Date of Patent: Sep. 19, 2006

(54) FLAT ANTENNA, ANTENNA UNIT AND BROADCAST RECEPTION TERMINAL APPARATUS

(75) Inventor: Kohei Mori, Kanagawa (JP)

(73) Assignee: Sony Corporation, (JP)

( * ) Notice: Subject to any disclaimer, the term of this patent is extended or adjusted under 35 U.S.C. 154(b) by 78 days.

(21) Appl. No.: 10/759,131

(22) Filed: Jan. 20, 2004

(65) Prior Publication Data

US 2004/0189542 A1     Sep. 30, 2004

(30) Foreign Application Priority Data

Jan. 21, 2003  (JP)  ............................ P2003-012679
Jan. 21, 2003  (JP)  ............................ P2003-012680

(51) Int. Cl.
   *H01Q 1/50*   (2006.01)
(52) U.S. Cl. .............................. 343/861; 343/700 MS; 343/702
(58) Field of Classification Search ......... 343/700 MS, 343/702, 829, 846, 850, 861, 895
   See application file for complete search history.

(56) References Cited

U.S. PATENT DOCUMENTS 5,699,071 A * 12/1997 Urakami et al. ............ 343/713
6,650,294 B1 * 11/2003 Ying et al. ........... 343/700 MS
6,670,924 B1 * 12/2003 Shoji et al. .................. 343/702
2002/0075186 A1   6/2002 Hamada et al.

FOREIGN PATENT DOCUMENTS

JP      2002-252516 A      9/2002

* cited by examiner

*Primary Examiner*—Shih-Chao Chen
(74) *Attorney, Agent, or Firm*—Rader, Fishman & Grauer PLLC; Ronald P. Kananen

(57) ABSTRACT

There is provided a flat antenna that includes a feed conductor, and at least one non-feed conductor positioned on either one side or both sides of the feed conductor depending on the required reception band. Thus, a flat antenna that is capable of receiving television broadcast can be miniaturized. In addition, a matching circuit that is so configured that the resonant frequency of the flat antenna is made variable is provided integrally. Through this matching circuit, the resonant frequency of the flat antenna can be varied so as to correspond to the desired reception channel.

7 Claims, 14 Drawing Sheets

Length = a * ( NUMBER OF TURNS OF MEANDER LINE ) + b

THICKNESS : 0.8mm
DIELECTRIC CONSTANT : 4.7

THICKNESS : 0.8mm
DIELECTRIC CONSTANT : 4.7

— NO NON-FEED CONDUCTOR
----- NON-FEED CONDUCTOR ON ONE SIDE
- - - NON-FEED CONDUCTOR ON BOTH SIDE

THICKNESS : 0.8mm
DIELECTRIC CONSTANT : 4.7

— xy FLAT PLANE
HORIZONTALLY POLARIZED WAVE, 470MHz

THICKNESS : 0.8mm
DIELECTORIC CONSTANT 4.7
MEANDER LINE THICKNESS : 0.2mm

FLAT ANTENNA, ANTENNA UNIT AND BROADCAST RECEPTION TERMINAL APPARATUS

CROSS REFERENCE TO RELATED APPLICATIONS

The present document claims priority to Japanese Priority Documents JP 2003-012679 and JP 2003-012680, both filed in the Japanese Patent Office on Jan. 21, 2003, the entire contents of which are incorporated herein by reference to the extent permitted by law.

BACKGROUND OF THE INVENTION

1. Field of the Invention

The present invention relates to a flat antenna, an antenna unit that is integrally equipped with matching (tuning) functions and a broadcast reception terminal apparatus, which are suitable for receiving television broadcast, for example.

2. Description of Related Art

As a broadcast receiver apparatus of a portable size that is capable of receiving television broadcast, there is a conventional TV broadcast reception terminal 100 as shown in FIG. 1.

Ordinarily, a stick-shaped antenna 101 for receiving television broadcast in the VHF (Very High Frequency) and UHF (Ultra High Frequency) bands is attached to such a TV broadcast reception terminal 100.

With respect to the UHF band, for example, of the UHF band ranging from 300 MHz to 3,000 MHz, television broadcast is carried out using the lower frequency band (470 MHz to 770 MHz). Therefore, the antenna 101 becomes larger. For this reason, as shown in the drawing, the antenna 101 of the conventional TV broadcast reception terminal 100 protrudes from the body of the terminal.

As a miniaturized antenna for mobile communication terminals such as the TV broadcast reception terminal mentioned above, there exist ones in which a three-dimensional structure is formed on a high dielectric material, such as ceramic, and electromagnetic waves are radiated by exciting a feed current thereto (see Japanese Patent Application Publication No. 2002-252516).

However, as described in Japanese Patent Application Publication No. 2002-252516, in order to configure a miniaturized antenna using a high dielectric material, it is necessary to form a complex three-dimensional structure. Therefore, there is a problem in that the structure of the substrate forming the antenna inevitably becomes multi-layered, and manufacturing costs increase.

In addition, when a miniaturized antenna is configured using a high dielectric material, the resonance value of the antenna becomes extremely high, and the frequency band extremely narrow. Therefore, when the range of frequencies used is wide, or a plurality of frequency bands (VHF band and UHF band) is covered, as in television broadcast, such a miniaturized antenna cannot be used.

Hitherto, there had been no miniaturized antenna unit that was capable of receiving electromagnetic waves whose frequency range used is low and whose frequency band is wide, as in television broadcast.

For this reason, in order to configure a broadcast reception terminal that is capable of receiving television broadcast, the antenna 101 had to protrude from the body of the terminal, thereby compromising portability.

SUMMARY OF THE INVENTION

A flat antenna related to an embodiment of the present invention includes a feed conductor, and a non-feed conductor provided on one side or on both sides of the above-mentioned feed conductor.

According to the present invention, by providing the non-feed conductor on one side or on both sides of the feed conductor depending on the required reception band, the size of a flat antenna that is capable of receiving television broadcast can be made smaller.

An antenna unit related to an embodiment of the present invention integrally includes a flat antenna, matching control signal generating means that generates a matching control signal corresponding to input data that is inputted, and a matching circuit that is so configured as to be able to vary the resonant frequency of the flat antenna.

According to the present invention, by generating, with the matching control signal generating means, a matching control signal corresponding to reception channel selection data selected with reception means, and by varying, with the matching circuit, the resonant frequency of the flat antenna so as to match the reception frequency for the reception channel, tuning can be performed.

Further, according to the present invention, the flat antenna is integrally equipped with the matching circuit. In this matching circuit, it is possible to vary the resonant frequency of the antenna element so as to correspond to the reception frequency of the reception channel. In other words, it is possible to vary the used frequency band.

Therefore, by configuring an antenna unit related to the present invention so as to be capable of receiving television broadcast, it is possible to miniaturize the antenna, and therefore a broadcast reception terminal apparatus that is superior in terms of portability can be realized.

DESCRIPTION OF THE PREFERRED EMBODIMENTS

Hereinafter, embodiments of the present invention will be described with reference to the drawings. In these embodiments, a broadcast reception terminal, an antenna unit and a flat antenna that receive airwaves in the UHF band will be given as examples.

Figure 2:
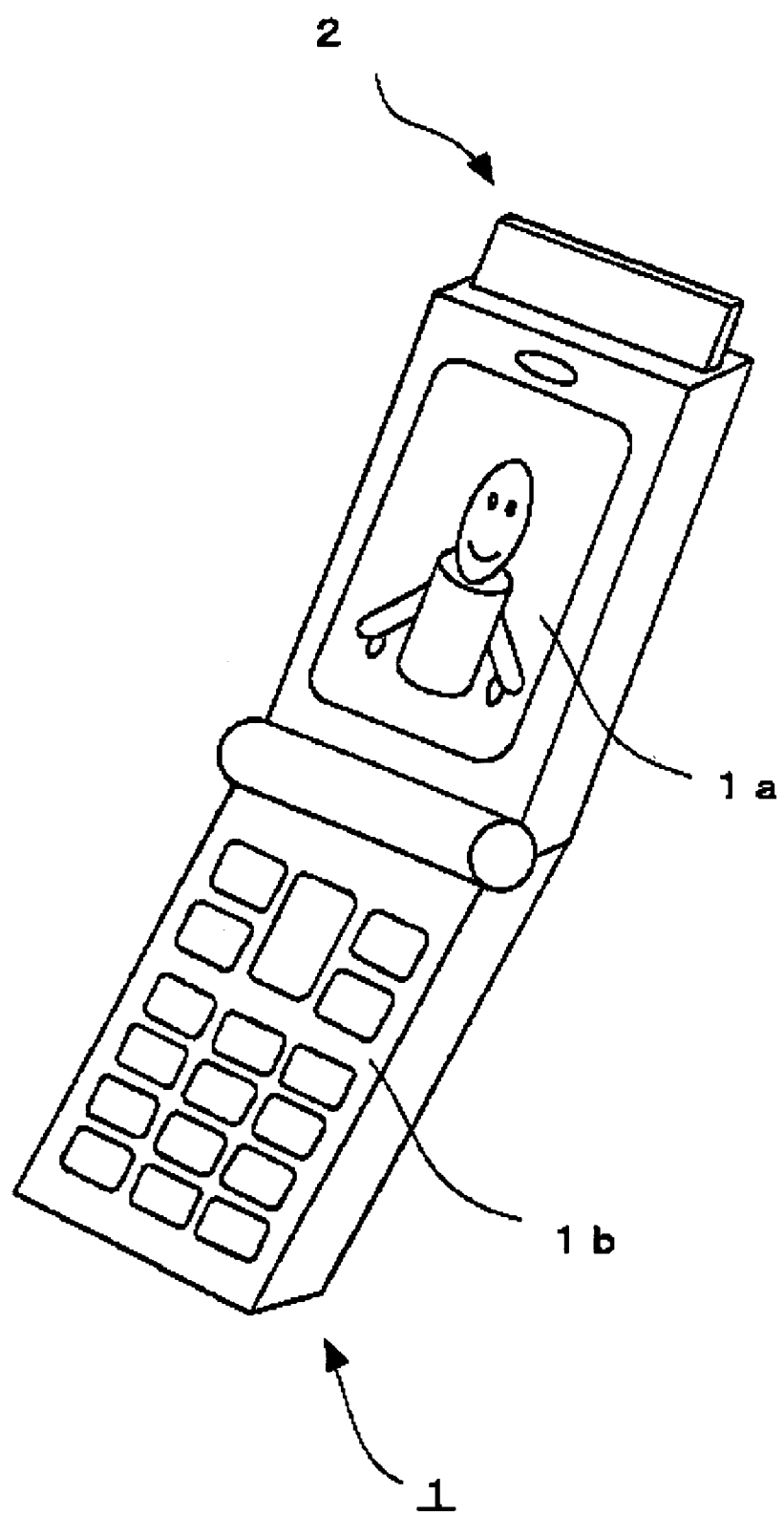
FIG. 2 is an external view of a portable terminal as an embodiment of the present invention.

FIG. 2 is an external view of a portable terminal that is capable of receiving television broadcast in the UHF band as an embodiment of the present invention.

The portable terminal 1 shown in FIG. 2 has such a structure that an antenna unit 2 can be attached to an upper end section thereof. By attaching the antenna unit 2, television broadcast, for example, can be received and television pictures can be displayed on its display screen 1a. Channel selection can be performed through an operation section 1b.

The antenna unit 2 has a flat antenna 11 for receiving at least airwaves in the VHF band and/or UHF band for television broadcast. The antenna unit 2 will be described later.

Figure 1:
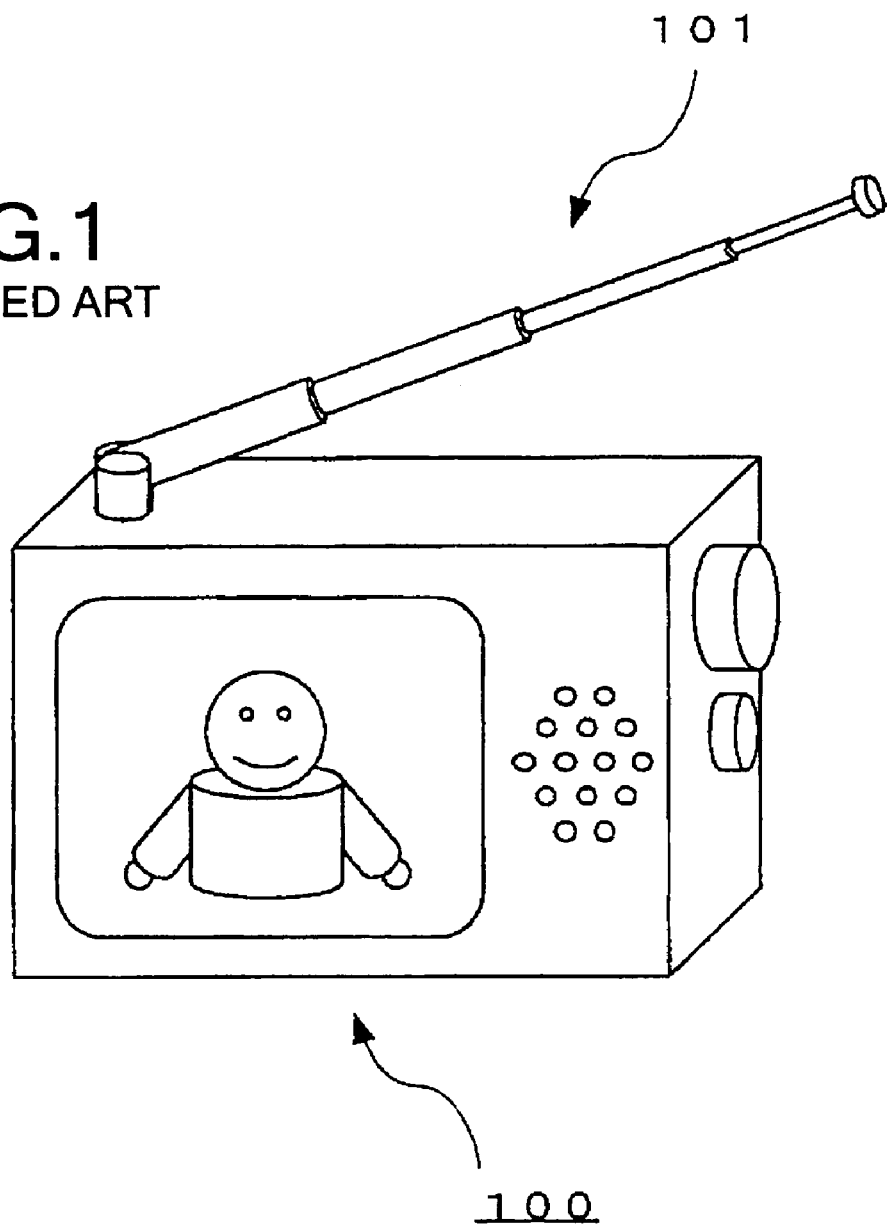
FIG. 1 is an external view of a conventional broadcast reception terminal.

In such a portable terminal 1 of the present embodiment, as compared to the broadcast reception terminal shown in FIG. 1 with the stick-shaped antenna, the antenna section is smaller, and the mobile terminal 1 is thus superior in terms of portability.

In FIG. 2, because the portable terminal 1 is so configured that the antenna unit 2 is detachable, part of the antenna unit 2 is exposed from the upper portion of the portable terminal 1. However, if the antenna unit 2 is mounted inside the portable terminal 1, the portable terminal 1 can be configured in such a manner that the antenna unit 2 would not be visible from outside.

In addition, if the portable terminal 1 is equipped with a attaching/detaching section in or from which a card-type memory may be attached or detached, the antenna unit 2 may be attached utilizing the attaching/detaching section for the card-type memory.

Figure 3:
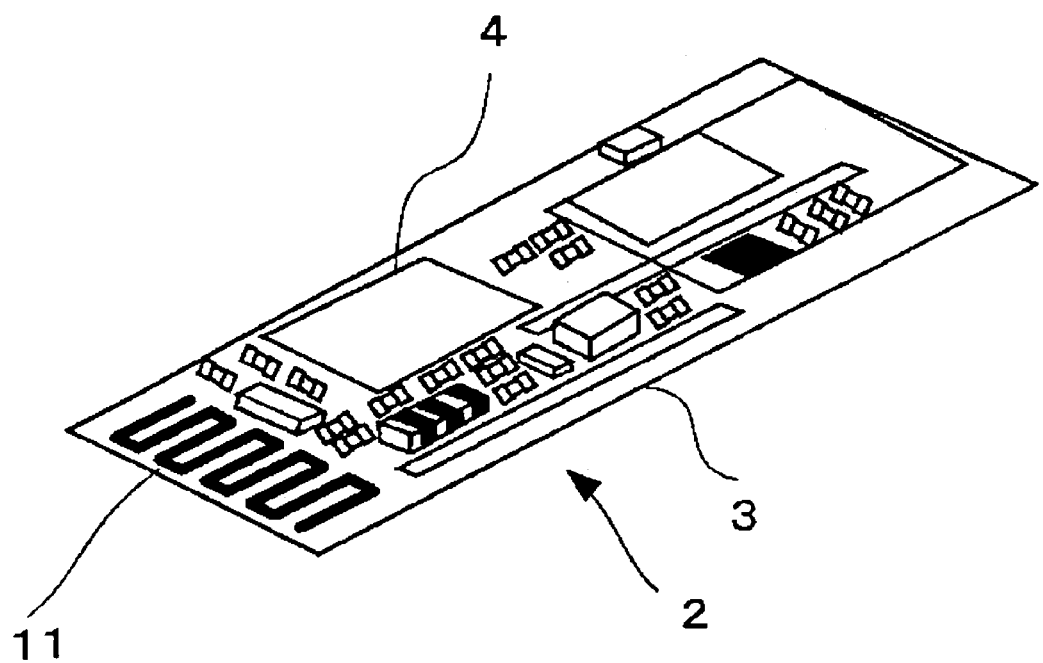
FIG. 3 is an external configuration view of an antenna unit as an embodiment of the present invention.

FIG. 3 shows the external configuration of the antenna unit 2 mentioned above.

In FIG. 3, the antenna unit 2 is formed on a print circuit board 3. The antenna unit 2 is comprised of the flat antenna 11, and various electronic components such as capacitors, resistors, coils, ICs and the like.

On the print circuit board 3 are also mounted various electronic components that form a receiver 15, which will be described later.

On the print circuit board 3 are formed an electrode pattern for forming a circuit by connecting the various electronic components 4 as well as an electrode pattern that forms the flat antenna 11.

The electrode pattern for the flat antenna 11 will be described later.

In such an antenna unit 2 of the present embodiment, by forming the flat antenna 11 on the print circuit board 3 in forming a miniaturized antenna, there is no need to make, as is conventional, the print structure 3 be a multi-layered structure, and to form a complex metal pattern three-dimensionally. Thus, it is possible to reduce the cost of manufacturing miniaturized antennas that can be used for television broadcast.

In addition, by forming the flat antenna 11 directly on the print circuit board 3, there is an advantage in that mounting costs can be reduced as compared to a case where a television broadcast antenna to be mounted on the antenna unit 2 is formed separately.

However, the television broadcast antenna to be formed in the antenna unit 2 does not have to be formed directly on the print circuit board 3.

Figure 4:
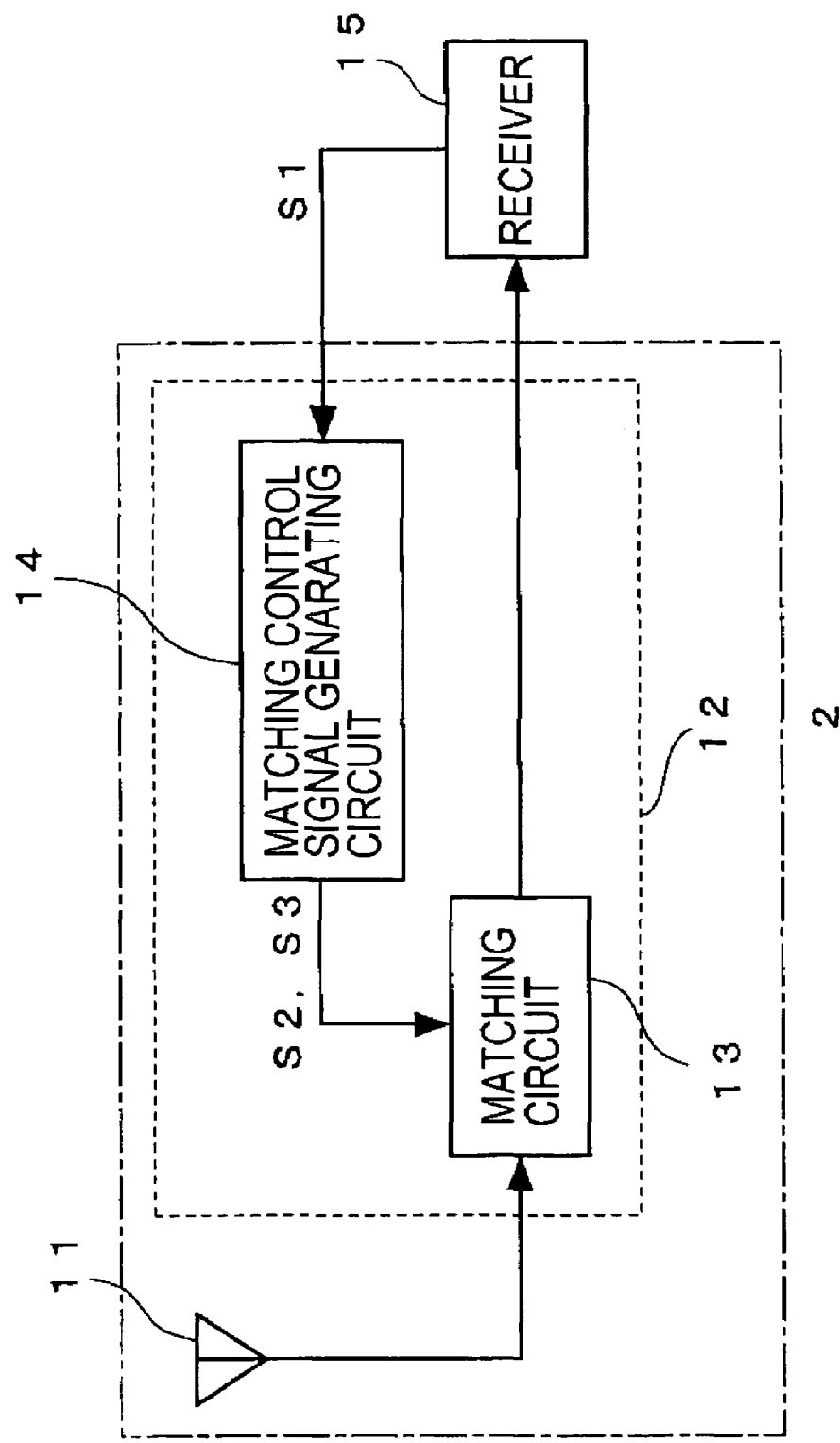
FIG. 4 is a block diagram showing the configuration of the antenna unit.

FIG. 4 is a block diagram showing the electrical configuration of the antenna unit 2.

The antenna unit 2 includes the flat antenna 11 and a matching section 12. The flat antenna 11 is connected to the receiver 15 via the matching section 12.

The matching section 12 includes a matching circuit 13 and a matching control signal generating circuit 14, and performs matching, including the flat antenna 11, so that the flat antenna 11 can receive electromagnetic waves (airwaves) efficiently in the reception frequency band of the reception channel selected by the receiver 15.

Based on a matching control signal S2 from the matching control signal generating section 14, the matching circuit 13 carries out matching for the antenna unit 2 including the flat antenna 11. The circuit configuration of the matching circuit 13 will be described later.

The matching control signal generating circuit 14 generates the matching control signal S2 corresponding to a reception channel selection signal S1 from the receiver 15. The configuration of the matching control signal generating circuit 14, too, will be described later.

The receiver 15 may be comprised of, among other things, a tuner for selecting a desired channel from television airwaves inputted via the antenna unit 2, and a demodulating circuit for demodulating the selected airwave signals. The receiver 15 is, along with the antenna unit 2, formed integrally on the print circuit board 3 shown in FIG. 3. Naturally, the receiver 15 may also be formed on the side of the portable terminal 1.

In the antenna unit 2 of the present embodiment the frequency range for which the flat antenna 11 can be used may be expanded by variably controlling the matching frequency of the flat antenna 11 based on the reception channel selection signal S1 from the receiver 15. This frequency range for which the flat antenna 11 can be used may be expanded even if the matching frequency band to which the flat antenna 11 is tuned is narrow, or even if the matching frequency band to which the flat antenna 11 is tuned is outside of the used frequency band.

Figure 5:
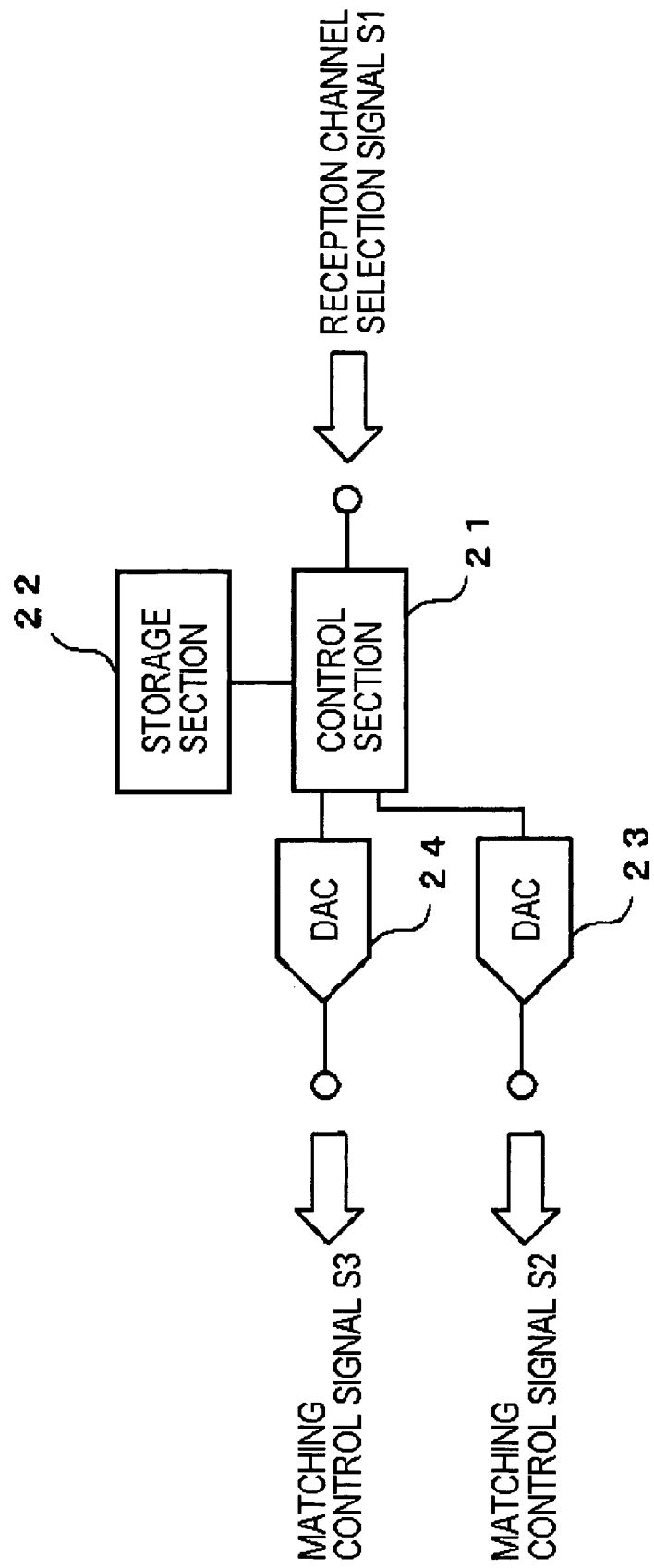
FIG. 5 is a block diagram showing an example configuration of a matching control signal generating circuit.

FIG. 5 is a block diagram showing a configuration example of the matching control signal generating circuit 14.

The matching control signal generating circuit 14 includes a control section 21, a storage section 22 and DA converters 23 and 24.

When the reception channel selection signal S1 is inputted from the receiver 15, the control section 21 searches the data stored in advance in the storage section 22 for data corresponding to the inputted reception channel selection signal S1.

Based on the data searched, matching control data for controlling the capacitance value of the varactor diode DV of the matching circuit 13, which will be described later, and matching control data for controlling the switch 16 for switching the inductance value of the matching coil L are generated and outputted to the DA converters (DAC) 23 and 24.

The DACs 23 and 24 perform digital/analog conversion on the matching data from the control section 21 to obtain matching control signals S2 and S3, and outputs them to the matching circuit 13.

Thus, by performing the switching of the inductance value of the matching coil L of the matching circuit 13, and by performing the variable control of the capacitance value of the varactor diode DV, the resonant frequency of the flat antenna 11 is matched to the frequency range of the reception channel selected with the receiver 15 through impedance matching.

The matching operation in the matching section 12 need not be performed for each frequency at which reception is carried out with the receiver 15, and instead the matching operation may be carried out with the matching circuit 13 of a similar configuration for a plurality of channels that are adjacent, for example.

Figure 6:
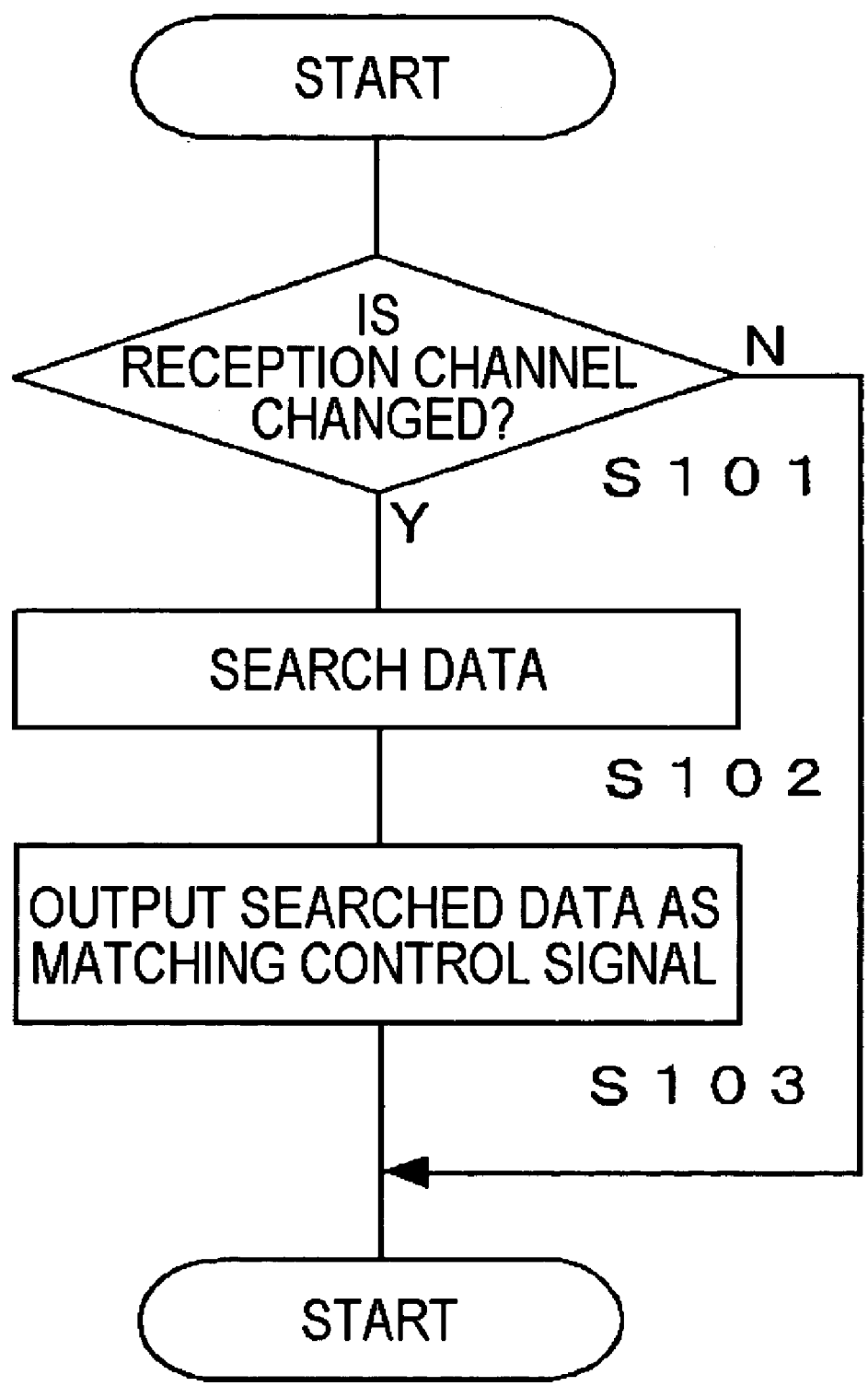
FIG. 6 is a flowchart illustrating a processing operation carried out by the matching control signal generating circuit.

FIG. 6 is a flowchart illustrating a process carried out by the control section 21 of the matching control signal generating circuit 14 mentioned above.

First, in step S101, the control section 21 judges whether or not the reception channel selection signal S1 from the receiver 15 has been changed. If it is judged that the reception channel selection signal S1 has been changed, the process proceeds to step S102.

In step S102, the data stored in the storage section 22 is searched for data corresponding to the reception channel selection signal S1. In step S103, a matching control signal is generated from the searched data and then outputted, and the process is terminated.

On the other hand, if, in step S101, it is determined that the reception channel selection signal S1 from the receiver 15 has not been changed, the process is then terminated.

Figure 7:
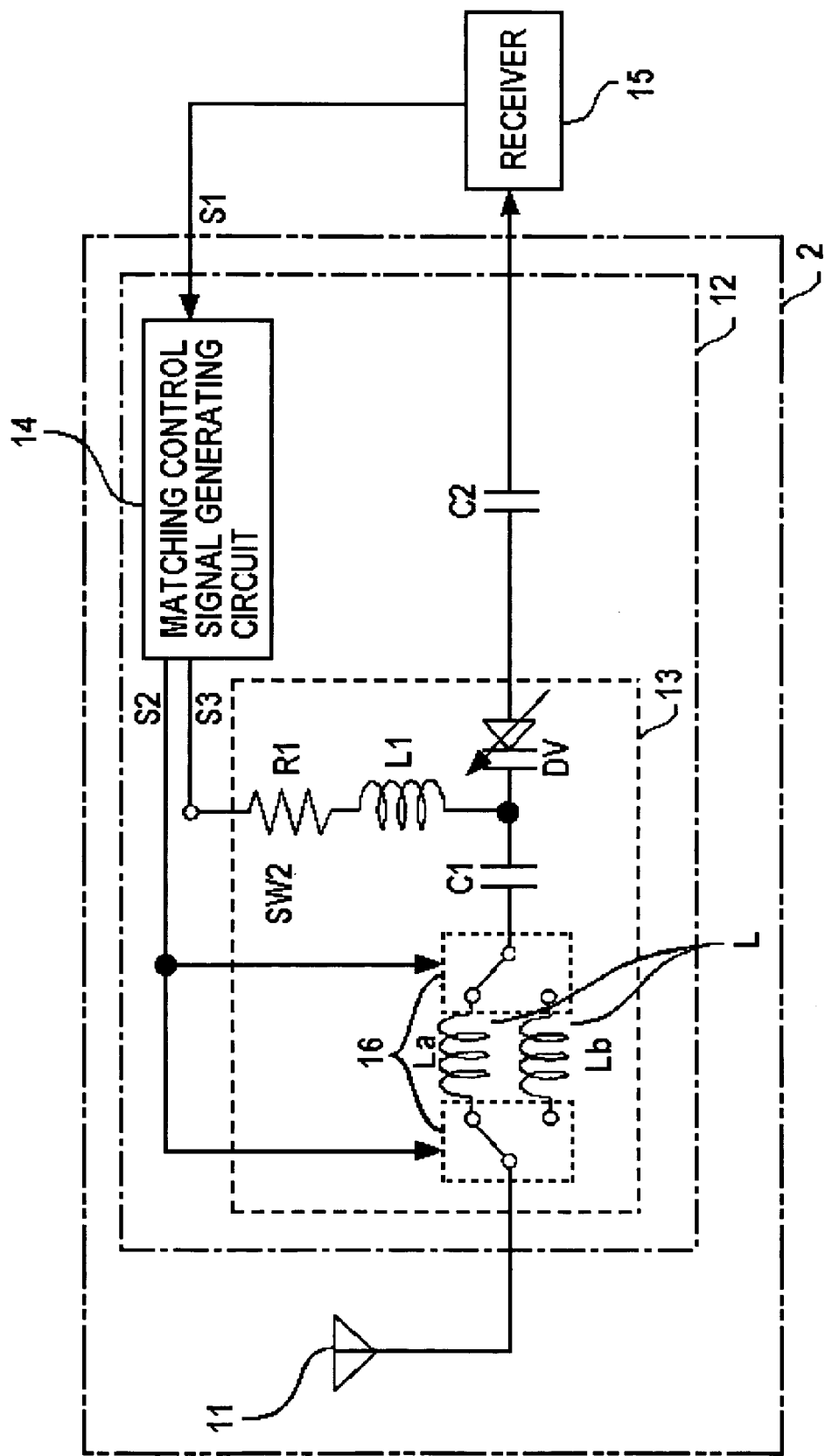
FIG. 7 shows a configuration example of a matching circuit.

FIG. 7 shows an example of the circuit configuration of the matching circuit 13 mentioned above.

The matching circuit 13 is formed by a connective circuit in which the matching coil L and the varactor diode DV, which is a variable capacitance diode, are connected serially between the flat antenna and the receiver 15.

The matching coils L include two coils La and Lb having different inductances, and by way of the switch 16, either the coil La or the coil Lb is inserted between the flat antenna 11 and the receiver 15. In addition, capacitors C1 and C2 are DC cut capacitors.

The switch 16 may include, for example, an RF switch, and switching control is carried out with the matching control signal (switching signal) S2 from the matching control signal generating circuit 14.

The varactor diode DV has its capacitance value controlled by the matching control signal (control voltage signal) S3 that is supplied from the matching control signal generating circuit 14 via an adjustment resistor R1 and a choke coil L1.

At the matching circuit 13, by switching the switch 16 with the matching control signal S2 from the matching control signal generating circuit 14, one of the coils La and Lb of differing inductances is selected as the matching coil L.

Then, the capacitance of the varactor diode DV is altered by the matching control signal S3 from the matching control signal generating circuit 14.

Thus, the switching of the frequency band to which the antenna 11 is matched is carried out based on the reception channel selection signal S1 from the receiver 15.

It is to be understood that the circuit configuration of the matching circuit 13 shown in FIG. 7 is merely an example, and that a different circuit configuration may be adopted for the matching circuit 13 so long as the resonant frequency of the flat antenna is variable based on the matching control signal from the matching control signal generating circuit 14.

Figure 8:
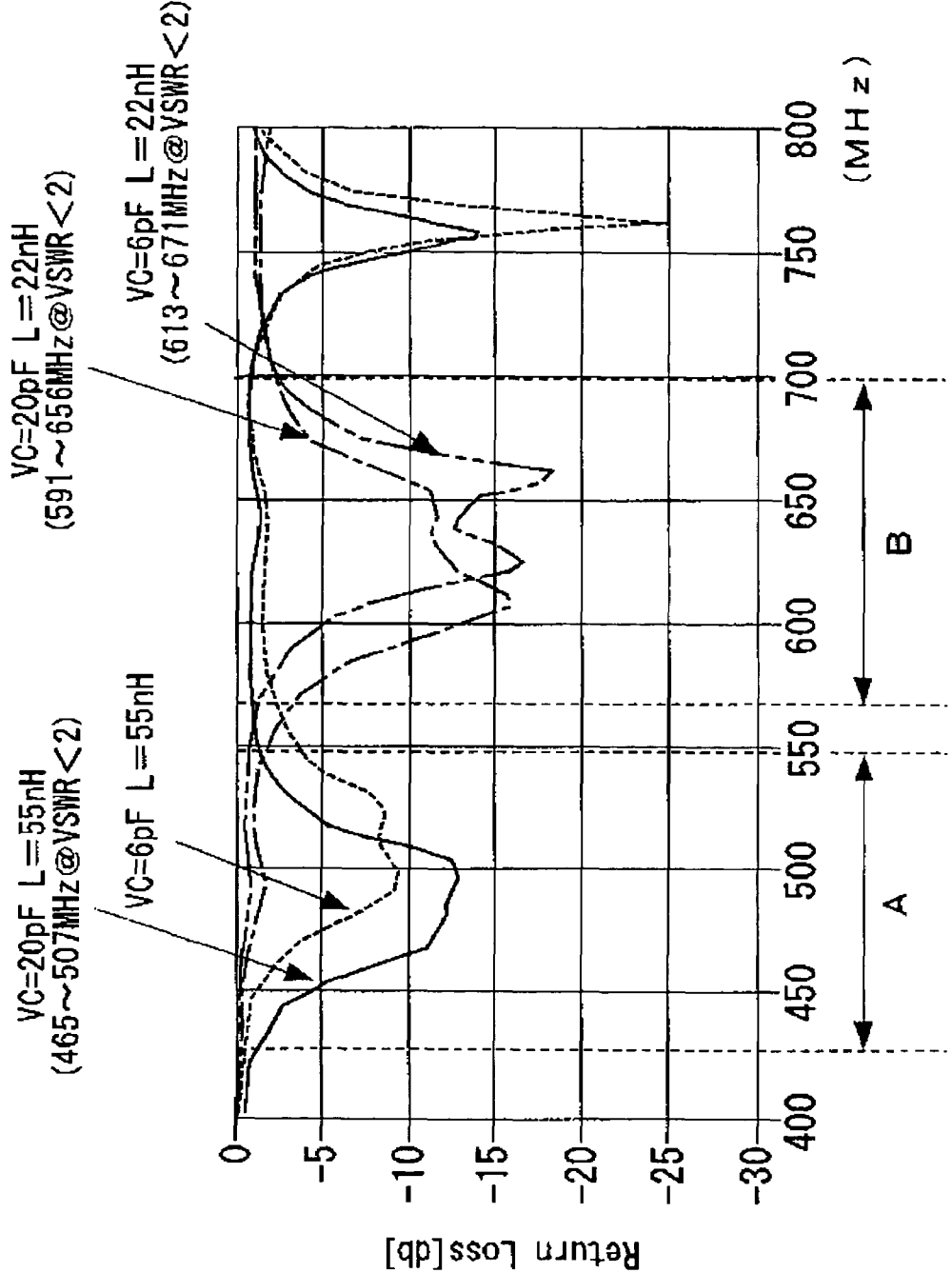
FIG. 8 is a chart illustrating the characteristics of the antenna unit.

FIG. 8 shows characteristics of the antenna unit 2 related to the present embodiment.

The characteristics of the antenna unit 2 shown here are the return loss characteristics in the used frequency band in a case where inductances of 55 nH and 22 nH are selected for the matching coil L, and where, of the variable capacitance range of the varactor diode DV of 6 pF to 20 pF, the minimum capacitance (6 pF) and maximum capacitance (20 pF), are selected for the varactor diode DV.

From FIG. 8, it can be seen that the matching frequency band of the flat antenna 11 can be varied widely by varying the inductance of the matching coil L inserted between the flat antenna 11 and the receiver 15, and the capacitance of the varactor diode DV.

For example, by making the inductance of the matching coil L be 55 nH while making the capacitance of the varactor diode DV be variable within the range of 6 pF to 20 pF, the matching (resonant) frequency band of the flat antenna 11 can be set to frequency range A (430 MHz to 550 MHz).

In addition, by making the inductance of the matching coil L be 22 nH while making the capacitance of the varactor diode DV be variable within the range of 6 pF to 20 pF, the matching (resonant) frequency band of the flat antenna 11 can be set to frequency range B (570 MHz to 700 MHz).

In other words, according to the antenna unit 2 of the present embodiment, by making the inductance of the matching coil L and the capacitance of the varactor diode DV be variable, the matching frequency band of the flat antenna 11 can be expanded to 430 MHz to 700 MHz.

Therefore, by adopting the antenna unit 2 of the present embodiment as a television broadcast antenna, broadcast waves can be received in the wide frequency range of the UHF band.

Thus, whereas, conventionally, using a miniaturized antenna as an antenna for receiving television broadcast meant that the usable frequency band became narrower and airwaves that could be received limited, by using the antenna unit 2 such as that of the present embodiment as a television broadcast antenna, since the usable frequency band can be broadened, almost all broadcast waves in the UHF band can be received.

Therefore, by using the antenna unit 2 of the present embodiment in a TV broadcast reception terminal, a stick-shaped antenna like the one shown in FIG. 1 becomes unnecessary, and the TV broadcast reception terminal can be made smaller. Consequently, its portability can be improved.

Further, conventionally, in configuring a miniaturized antenna of a wide frequency band, because band selection was required in back-end filters not shown in drawing, there was a disadvantage in that antennas tended to become larger. In the present embodiment, by altering the matching frequency band of the flat antenna 11 itself, the burden of band selection in filters of later stages can be made lighter, and the antenna and filter can be prevented from becoming larger.

Further, a conventional miniaturized antenna of a wide matching frequency band and a wide usable frequency band often gives rise to malfunctioning such as a significant drop in gain at particular frequency bands. For this reason, conventional antennas had a disadvantage in that the gain in their usable frequency band was uneven, but when an antenna is configured as in the present embodiment, the unevenness in gain in the usable frequency band can be prevented.

Next, the flat antenna 11 provided on the antenna unit 2 above will be described.

Figure 9:
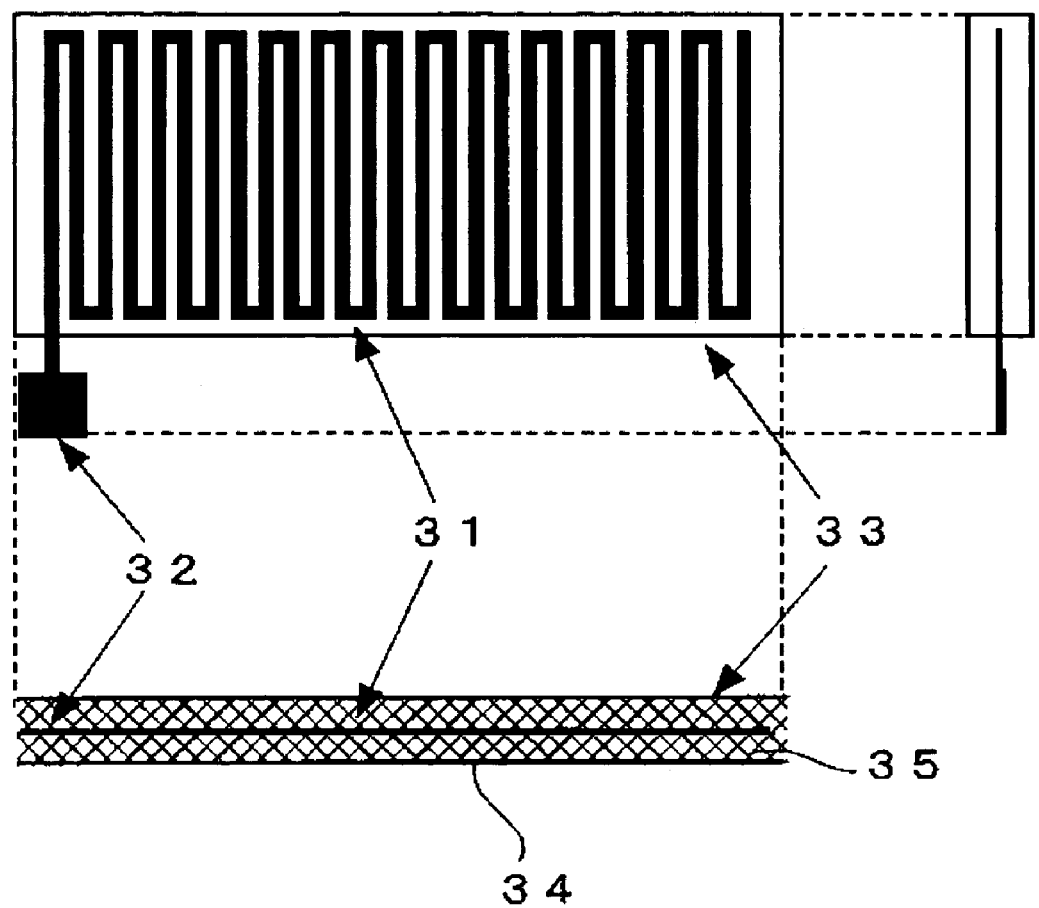
FIG. 9 is a diagram showing the structure of a flat antenna as an embodiment of the present invention.

FIG. 9 shows an example of the structure of the flat antenna 11 related to the present embodiment.

In this flat antenna 11, by utilizing an inner layer electrode of a print circuit board, for example, to form a meandering metal pattern, a feed conductor 31 of a predetermined length is formed.

Then, by supplying a feed current with a feed section 32 provided on one end of the feed conductor 31, a radiating element for radiating electromagnetic waves is formed.

One of the reasons the feed conductor 31 is made to meander is so that the resonant frequency of the flat antenna is lowered and so that the flat antenna may be used as a television broadcast antenna, while its shape is made smaller.

The shape of the feed conductor 31 is not necessarily limited to a meandering shape. The feed conductor 31 may instead have a helical shape.

In addition, in the flat antenna 11, a non-feed conductor 33 is positioned in a layer above the feed conductor 31. By so doing, the non-feed conductor 33 and the feed conductor 31 are electromagnetically coupled, and the radiation of electromagnetic waves from the radiating element can be facilitated.

In addition, by thus positioning the non-feed conductor 33 in a layer above the feed conductor 31, the resonant frequency of the flat antenna 11 can be lowered through the wavelength shortening effects of the non-feed conductor 33.

Further, in the flat antenna of the present embodiment, by positioning a non-feed conductor 34 in a layer beneath the feed conductor 31 in addition to the non-feed conductor 34 in the layer above the feed conductor 31, the feed conductor 31 is electromagnetically coupled, thereby facilitating the radiation of electromagnetic waves from the flat antenna 11, and further lowering the resonant frequency of the flat antenna 11.

Further, by thus forming the flat antenna 11, the feed conductor 31 is surrounded by the non-feed conductors 33 and 34. Therefore, as compared to two-dimensional flat antennas having a structure in which the feed conductor 31 is exposed, for example, there is an advantage in that the flat antenna 11 is made less susceptible to external factors.

In addition, in the flat antenna 11, a dielectric material 35 is provided between the feed conductor 31 and the non-feed conductor 33 and between the feed conductor 31 and the non-feed conductor 34. By thus providing the dielectric material 35, the resonant frequency of the flat antenna 11 can be lowered further through wavelength shortening effects.

Figure 10A:
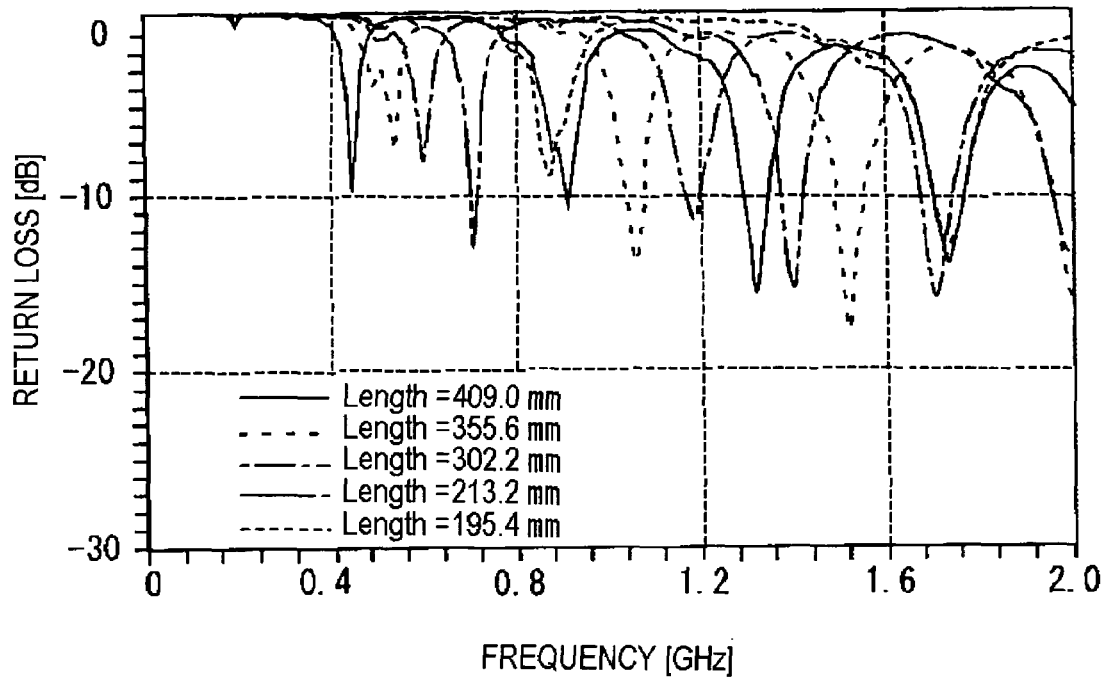
FIG. 10A illustrates how the resonant frequency of a flat antenna of an embodiment of the present invention varies with the length of its feed conductor.

FIG. 10A shows how the resonant frequency of the flat antenna 11 changes with the length of the feed conductor 31.

Figure 10B:
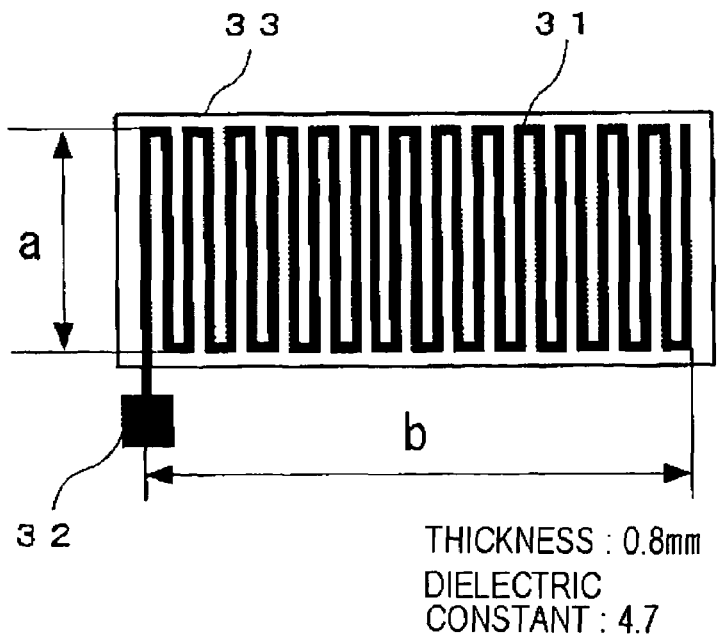
FIG. 10B shows a flat antenna of an embodiment of the present invention.

The length of the feed conductor 31 can be calculated, as shown in FIG. 10B, as follows: the length a of the shorter side of the meander line×(the number of turns of the meaner line)+the length b of the longer side of the meander line.

In addition, in this embodiment, the thickness of the print circuit board on which the flat antenna 11 is formed is 0.8 mm, and the dielectric material 35 is glass epoxy resin, which is the material of the print circuit board, whose dielectric constant is 4.7.

From FIG. 10A, it can be seen that as the length of the feed conductor 31 increases, the resonant frequency of the flat antenna 11 can be made lower. In addition, it can be seen that the entire length of the feed conductor 31 is half the wavelength of the used frequency.

Figure 11A:
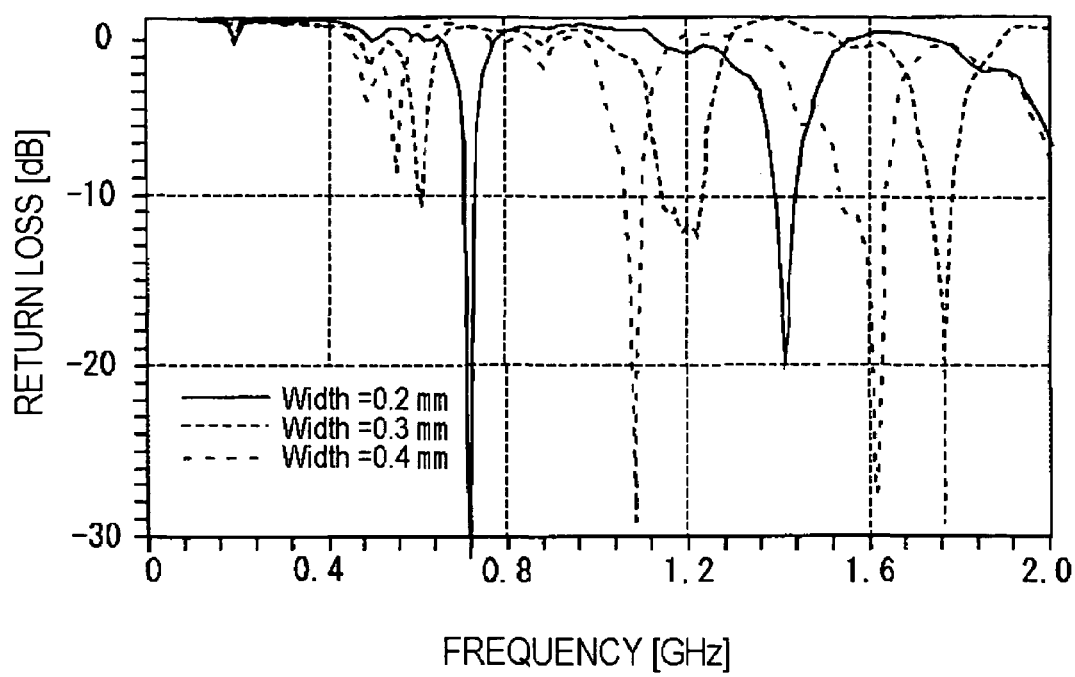
FIG. 11A illustrates how the resonant frequency of a flat antenna of an embodiment of the present invention varies with the width of its feed conductor.
Figure 11B:
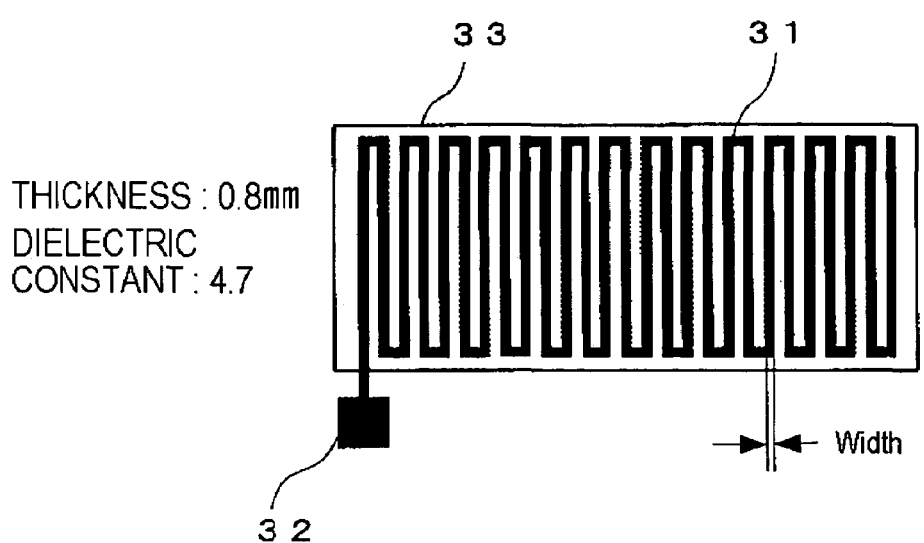
FIG. 11B shows a flat antenna of an embodiment of the present invention.

FIG. 11A shows how the resonant frequency of the flat antenna 11 changes with the width of the feed conductor 31. The width of the feed conductor 31 is defined in FIG. 11B.

From FIG. 11A, it can be seen that by increasing the width of the meandering feed conductor 31, the resonant frequency of the flat antenna 11 can be made lower.

Figure 12A:
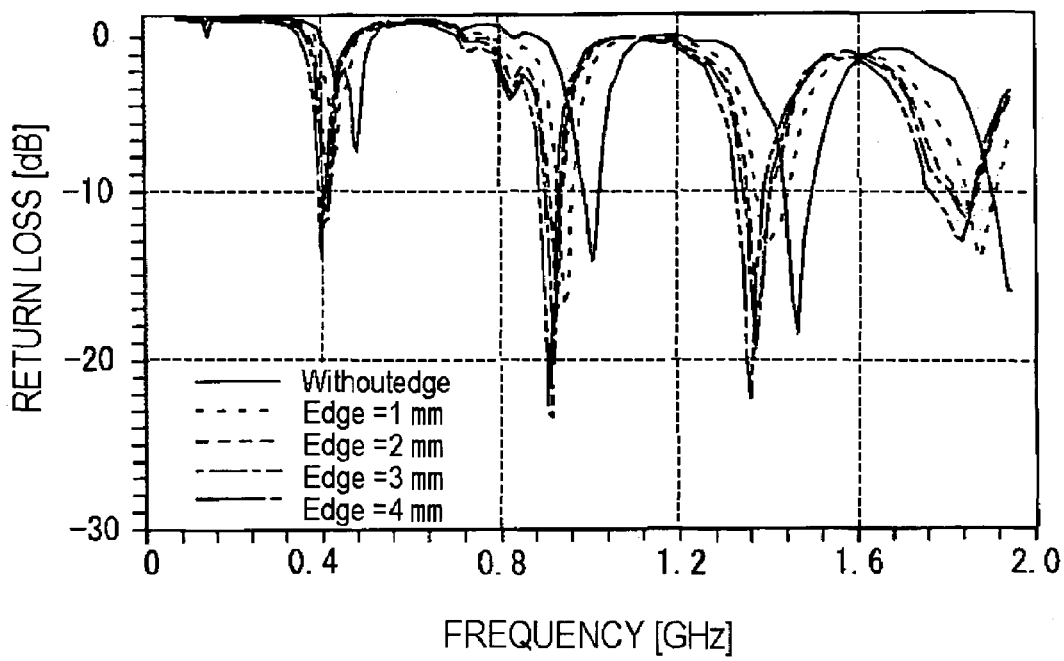
FIG. 12A illustrates how the resonant frequency of a flat antenna varies with the off-set of its non-feed conductor.

FIG. 12A shows how the resonant frequency of the flat antenna 11 changes with the off-set of the non-feed conductor.

Figure 12B:
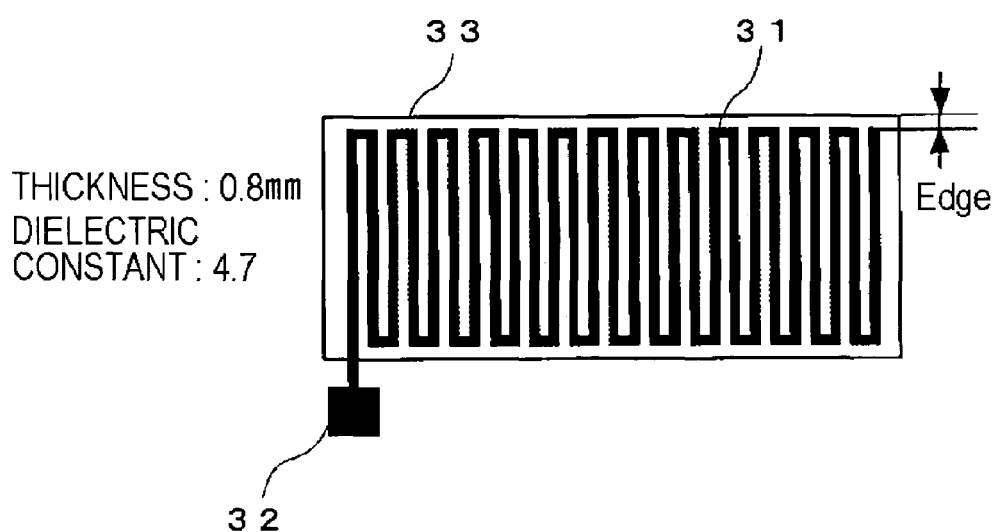
FIG. 12B shows a flat antenna of an embodiment of the present invention

The off-set (the edge) of the non-feed conductor 33 is represented by the distance between the feed conductor 31 and the non-feed conductor 33 as shown in FIG. 12B.

From FIG. 12A, it can be seen that by making the non-feed conductor 33 larger than the feed conductor 31, the resonant frequency of the flat antenna can be made lower.

Figure 13A:
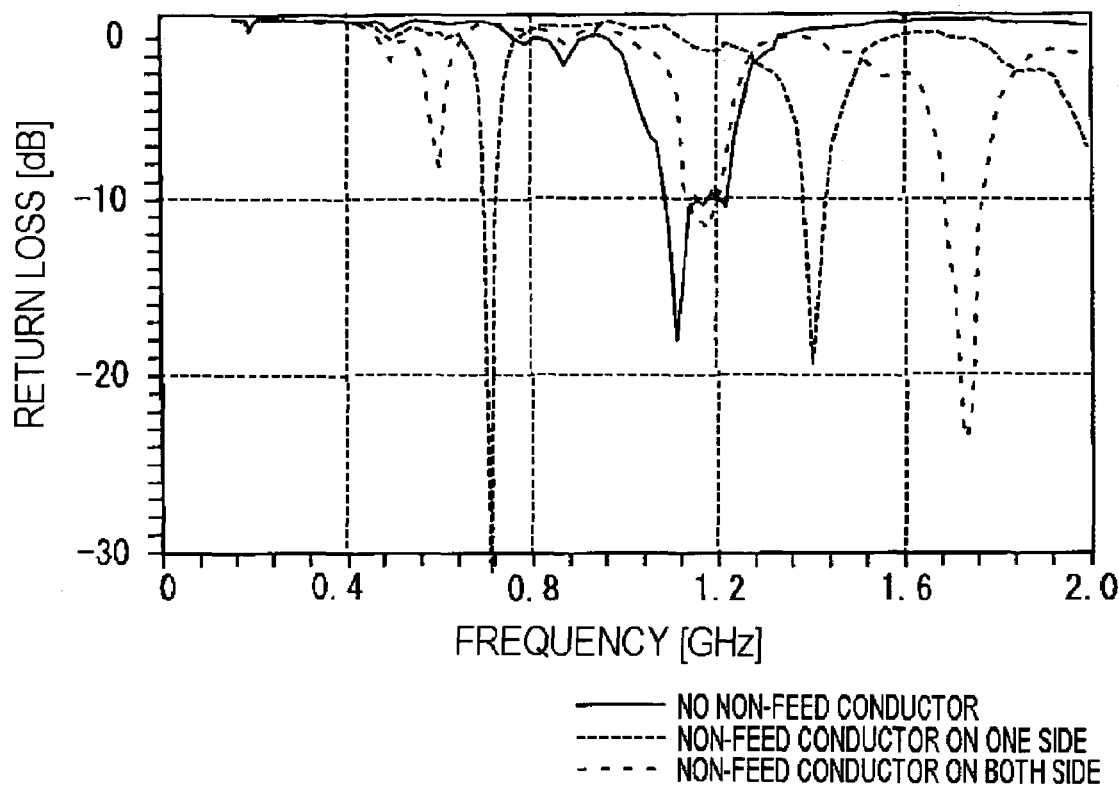
FIG. 13A illustrates the characteristics of the wave-length shortening effects of the non-feed conductor of a flat antenna of an embodiment of the present invention.

FIG. 13A is a chart that illustrates the wavelength shortening effect characteristics of the non-feed conductor of the flat antenna 11.

Figure 13B:
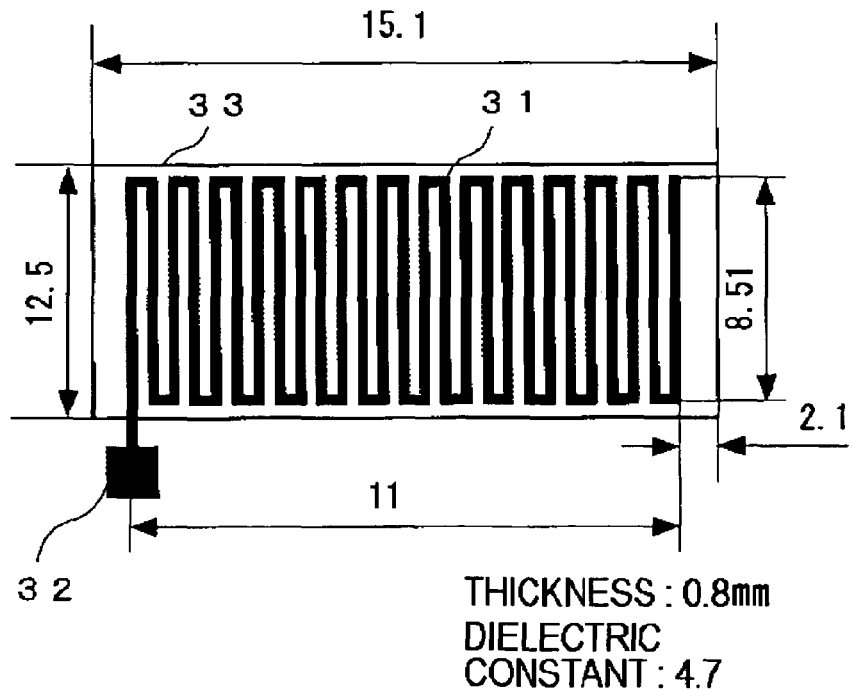
FIG. 13B is a flat antenna of an embodiment of the present invention.

The dimensions of the non-feed conductors 33 and 34 are defined in the manner shown in FIG. 13B.

As can be seen from FIG. 13A, when the non-feed conductor 33 is positioned on one side of the feed conductor 31, the resonant frequency of the flat antenna 11 can be lowered by approximately 40% as compared to a case where the non-feed conductor 33 is not provided.

Further, it can be seen that when the non-feed conductors 33 and 34 are positioned to both sides of the feed conductor 31, the resonant frequency of the flat antenna 11 can be lowered by approximately 50% as compared to a case where they are not provided.

Thus, in configuring the flat antenna 11, by providing the non-feed conductors 33 and 34 to both sides of the feed conductor 31, the resonant frequency of the flat antenna 11 can be made lower, and the flat antenna 11 can therefore be made smaller accordingly.

Figure 14A:
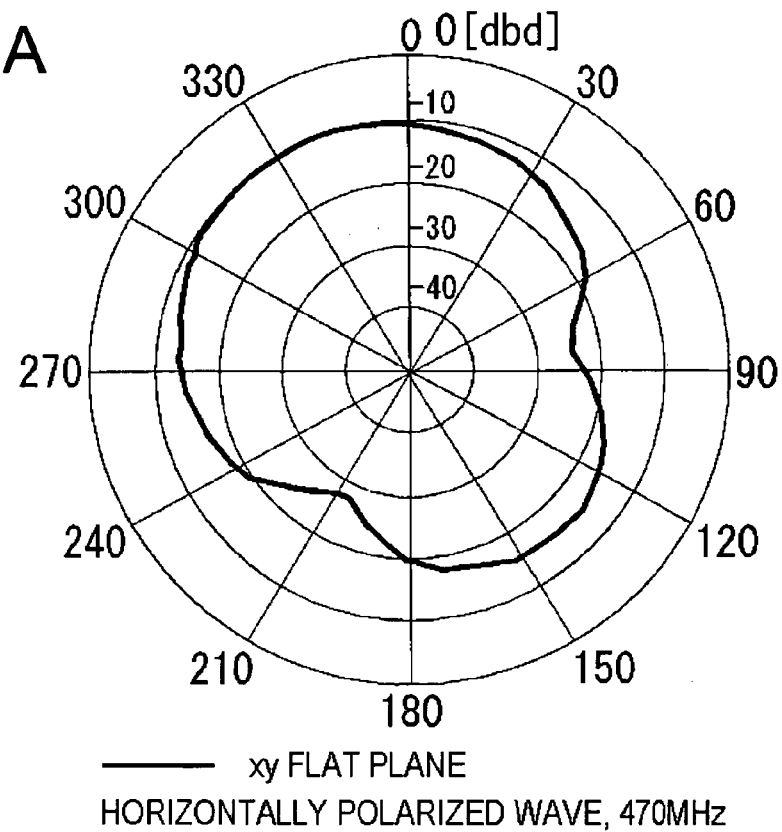
FIG. 14A is a chart illustrating the directional characteristics of a flat antenna of an embodiment of the present invention.

FIG. 14A illustrates the directional characteristics of the flat antenna 11 of the present embodiment.

Figure 14B:
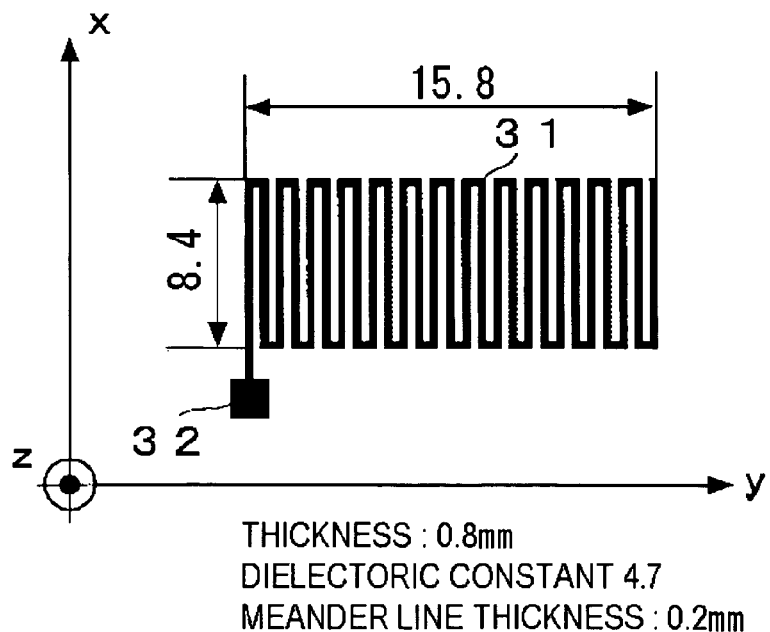
FIG. 14B is a flat antenna of an embodiment of the present invention.

The flat antenna 11 shown in FIG. 14B is so configured that the thickness of the print circuit board is 0.8 mm, the dielectric constant is 4.7, the entire length of the feed conductor 31 is 355.6 mm, the width thereof is 0.2 mm, the off-set is 0.1 mm, and measurements were taken under the condition that non-feed conductors are present on both sides.

From FIG. 14A, it can be seen that this particular flat antenna 11 has such directional characteristics that electromagnetic waves are radiated in the direction opposite to the power supply section 32.

Thus, a flat antenna 11 that can be used for television broadcast can be formed on the print circuit board 3, and manufacturing costs for the flat antenna 11 can be reduced.

Further, there is an advantage in that since there is no need to mount the flat antenna 11 on the antenna unit 2, mounting costs can be cut.

It should be understood that the structure of the flat antenna 11 described with respect to the present embodiment is merely an example, and that the flat antenna 11 may adopt other structures, too.

In addition, in the present embodiment, a description was given taking an antenna unit and a flat antenna that are suitable for receiving electromagnetic waves in the UHF band as an example, but these are merely examples. With a similar configuration, an antenna unit and a flat antenna for receiving electromagnetic waves of other frequency bands such as the VHF band can also be obtained.

Further, it is also possible to use antenna units and flat antennas related to the present invention as transmission antennas.

Since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalents of the claims are intended to be embraced therein.

What is claimed is:

1. An antenna unit, comprising:
    a flat antenna;
    matching control signal generating means for generating a matching control signal corresponding to inputted data; and
    a matching circuit that is so configured that the resonant frequency of said flat antenna is made variable based on said matching control signal outputted from said matching control signal generating means, wherein:
    said matching circuit comprises a connective circuit including a matching coil and a variable capacitance diode, and
    the resonant frequency of said flat antenna is variably controlled by varying the inductance of said matching coil and the capacitance of said variable capacitance diode based on said matching control signal.

2. The antenna unit of claim 1, wherein the flat antenna comprises a feed conductor between a first non-feed conductor and a second non-feed conductor, wherein each of said first and second non-feed conductors is adapted to control the frequency band of the flat antenna.

3. The antenna unit of claim 2, wherein a dielectric is between said feed conductor and said first non-feed conductor.

4. A broadcast reception terminal apparatus, comprising:
    a flat antenna;
    reception means for selecting and receiving airwaves of a desired reception channel;
    matching control signal generating means for generating a matching control signal corresponding to reception channel selection data supplied from said reception means; and
    a matching circuit that is so configured that the resonant frequency of said flat antenna is made variable based on said matching control signal outputted from said matching control signal generating means, wherein:
    said matching circuit comprises a connective circuit including a matching coil and a variable capacitance diode, and
    the resonant frequency of said flat antenna is variably controlled by varying the group including the inductance of said matching coil and the capacitance of said variable capacitance diode.

5. The broadcast reception terminal apparatus according to claim 4, wherein:
    the inductance of said matching coil is varied.

6. The broadcast reception terminal apparatus according to claim 4, wherein:
    the capacitance of said variable capacitance diode is varied.

7. The broadcast reception terminal apparatus according to claim 4, wherein:
    the group including the inductance of said matching coil and the capacitance of said variable capacitance diode is varied based on said matching control signal.

* * * * *